United States Patent
Hsu et al.

(10) Patent No.: US 10,177,094 B1
(45) Date of Patent: Jan. 8, 2019

(54) MEASUREMENT MARK AND METHOD FOR MONITORING SEMICONDUCTOR PROCESS

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Hsiao-Lin Hsu, Yunlin County (TW); En-Chiuan Liou, Tainan (TW); Yi-Ting Chen, Tainan (TW); Sho-Shen Lee, New Taipei (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/954,591

(22) Filed: Apr. 16, 2018

(30) Foreign Application Priority Data

Mar. 22, 2018 (CN) .......................... 2018 1 0238840

(51) Int. Cl.
*H01L 23/544* (2006.01)
*G01B 11/27* (2006.01)
*H01L 21/66* (2006.01)
*H01L 21/8234* (2006.01)

(52) U.S. Cl.
CPC .......... *H01L 23/544* (2013.01); *G01B 11/272* (2013.01); *H01L 22/12* (2013.01); *G01B 2210/56* (2013.01); *H01L 21/823431* (2013.01); *H01L 2223/5442* (2013.01); *H01L 2223/5446* (2013.01); *H01L 2223/54426* (2013.01)

(58) Field of Classification Search
CPC .................. H01L 23/544; H01L 2223/54426
See application file for complete search history.

(56) References Cited

U.S. PATENT DOCUMENTS

| | | | |
|---|---|---|---|
| 7,068,833 B1* | 6/2006 | Ghinovker | G03F 7/70633 382/143 |
| 7,196,429 B2* | 3/2007 | Yen | G03F 7/70633 257/797 |
| 2016/0093573 A1* | 3/2016 | Liou | G03F 7/70633 257/741 |
| 2016/0126194 A1* | 5/2016 | Hsu | G01B 11/002 257/797 |

OTHER PUBLICATIONS

Liou, Title of Invention: Overlay Mark Pattern and Method of Measuring Overlay, U.S. Appl. No. 14/737,475, filed Jun. 11, 2015.
Liou, Title of Invention: Overlay Mark and Method for Evaluating Stability of Semiconductor Manufacturing Process, U.S. Appl. No. 15/495,942, filed Apr. 24, 2017.

* cited by examiner

*Primary Examiner* — Peniel M Gumedzoe
(74) *Attorney, Agent, or Firm* — Winston Hsu

(57) ABSTRACT

A measurement make includes four rectangular regions having a first region and a second region arranged diagonally, and a third region and a fourth region arranged diagonally. A plurality sets of first inner pattern blocks, first middle pattern blocks, and first outer reference pattern blocks, are disposed within the first region. Each first inner pattern block comprises line patterns and a block pattern. The block pattern has multiple space patterns arranged therein. The first inner pattern block is rotational symmetrical to the first middle pattern block.

13 Claims, 5 Drawing Sheets

MEASUREMENT MARK AND METHOD FOR MONITORING SEMICONDUCTOR PROCESS

BACKGROUND OF THE INVENTION

1. Field of the Invention

The present invention relates to a measurement mark. More particularly, the present invention relates to a measurement mark for a self-aligned double patterning (SADP) process and a method for monitoring the SADP process.

2. Description of the Prior Art

Integrated circuit (IC) technology continues to advance, and by reducing the component size, lower manufacturing costs, higher component accumulation, faster speed, and better performance can be achieved.

At present, elements or circuits in an integrated circuit still need to be formed through a lithography technique, in which an exposure device allows light to be projected through a photomask onto a photoresist layer on a wafer, so that the photoresist layer has patterns of integrated circuit devices or lines. The image is subsequently transferred to the wafer by developing, etching, and other steps. The resolution of the exposure apparatus limits the formation of smaller device patterns. For example, forming a fin field effect transistor (FinFET) having a fin structure is limited due to existing lithography resolution capabilities.

Advanced technology nodes have used multiple patterning techniques to achieve pitch reduction, but current optical lithography processes are facing new challenges in the precise positioning of semiconductor features. Self-alignment double patterning (SADP) processes have been used in fin field effect transistor elements to form fin semiconductor structures, the pitch of which can generally be lower than the resolution capability of lithography.

The SADP process bares compounding effects from successive Reactive Ion Etch (RIE) and spacer depositions. These processes induce a shift in the pitch value from one fin compared to another neighboring fin. This is known as pitch walking. Pitch walking affects device performance as well as later processes which work on an assumption that there is consistent spacing between fins.

SUMMARY OF THE INVENTION

The present invention provides a measurement mark and a method for monitoring variation in semiconductor processes, which is particularly suitable for a self-aligned double patterning (SADP) process.

One embodiment of the invention provides a measurement mark including four rectangular regions arranged in a 2×2 array about a center. The four rectangular regions include a first region and a second region arranged diagonally, and a third region and a fourth region arranged diagonally. A plurality sets of first inner pattern blocks, first middle pattern blocks, and first outer reference pattern blocks is disposed within the first region. Each of the first inner pattern blocks comprises a plurality of line patterns extending along a first direction and a block pattern having a plurality of space patterns arranged therein. Each of the first middle pattern blocks comprises a plurality of line patterns extending along the first direction and a block pattern having a plurality of space patterns arranged therein. The first inner pattern block is rotational symmetrical to the first middle pattern block. A first spacer pattern is disposed along a periphery of each of the line patterns. A second spacer pattern is disposed along a periphery of each of the space patterns. A third spacer pattern is disposed along the periphery of each of the block patterns and surrounding the second spacer patterns.

Another embodiment of the invention provides a method for monitoring a semiconductor process. A wafer having thereon a material layer is provided. A semiconductor process is performed to form a measurement mark in the material layer. The measurement mark comprises four rectangular regions arranged in a 2×2 array about a center. The four rectangular regions comprise a first region and a second region arranged diagonally, and a third region and a fourth region arranged diagonally. A plurality sets of first inner pattern blocks, first middle pattern blocks, and first outer reference pattern blocks is disposed in the first region. Each of the first inner pattern blocks comprises a plurality of line patterns extending along a first direction and a block pattern having a plurality of space patterns arranged therein. Each of the first middle pattern blocks comprises a plurality of line patterns extending along the first direction and a block pattern having a plurality of space patterns arranged therein. The first inner pattern block is rotationally symmetrical to the first middle pattern block. A first offset between the first inner pattern blocks and the first outer reference pattern blocks is measured. A second offset between the first middle pattern blocks and the first outer reference pattern blocks is measured.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 and FIG. 3 are schematic diagrams illustrating one embodiment of a measurement mark according to the present invention, wherein FIG. 3 is an enlarged schematic view of an inner pattern block in FIG. 2.

DETAILED DESCRIPTION

In order that those skilled in the art to which the present invention pertains can further understand the present invention, some exemplary embodiments of the present invention are described below, and in combination with the accompanying drawings, the detailed contents of the present invention and the desired effects thereof will be described in detail.

The invention relates to a measuring mark. In today's advanced semiconductor processes, the critical dimension (CD) is increasingly shrinking. For example, in a process using a self-aligned double patterning (SADP) process to form a FinFET, many factors can contribute to the size of the resulting fin structure, causing the size of each fin structure to shift or lead to pitch walking. The present invention thus provides a measurement mark for monitoring the pattern shift during semiconductor processing.

Figure 1:
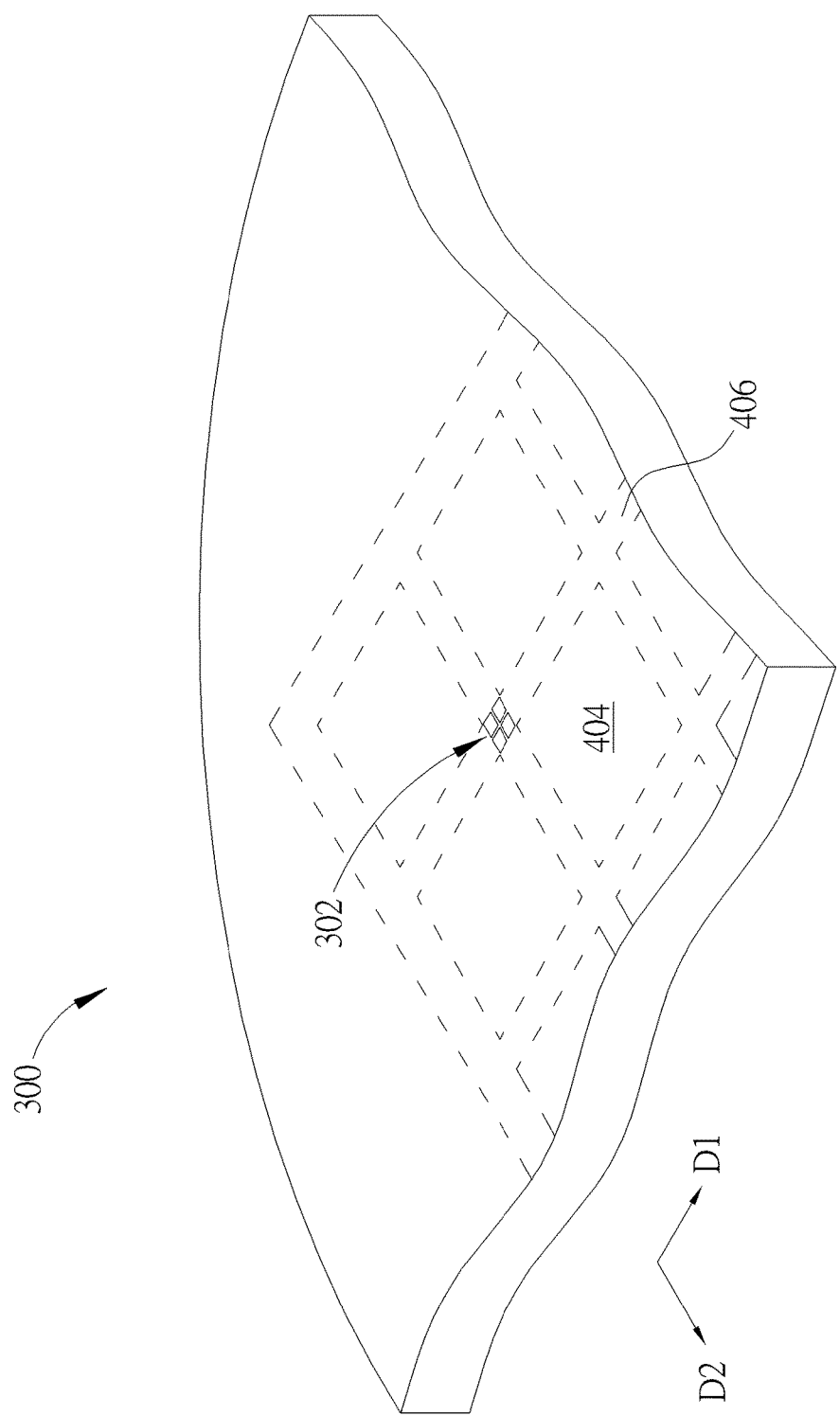
FIG. 1 is a schematic diagram showing the location of a measurement mark on a wafer according to the present invention.

First, referring to FIG. 1, a schematic diagram showing the location of a measurement mark on a wafer according to the present invention is shown. As shown in FIG. 1, a wafer 300 has a plurality of die regions 404, preferably arranged in an array, and a plurality of scribe lane regions 406 between the die regions 404. The scribe lane regions 406 may extend along a first direction D1 or a second direction D2. Preferably, the first direction D1 and the second direction D2 are perpendicular to each other.

The measurement mark 302 provided by the present invention may be in the same area as other marks, such as alignment marks. According to an embodiment of the present invention, the measurement mark 302 may be located on the scribe lane region 406, preferably on the scribe lane region 406 between the four die regions 404. In other embodiments, the measurement mark 302 may also be located within the die area 404 depending on the product design requirements.

Figure 2:
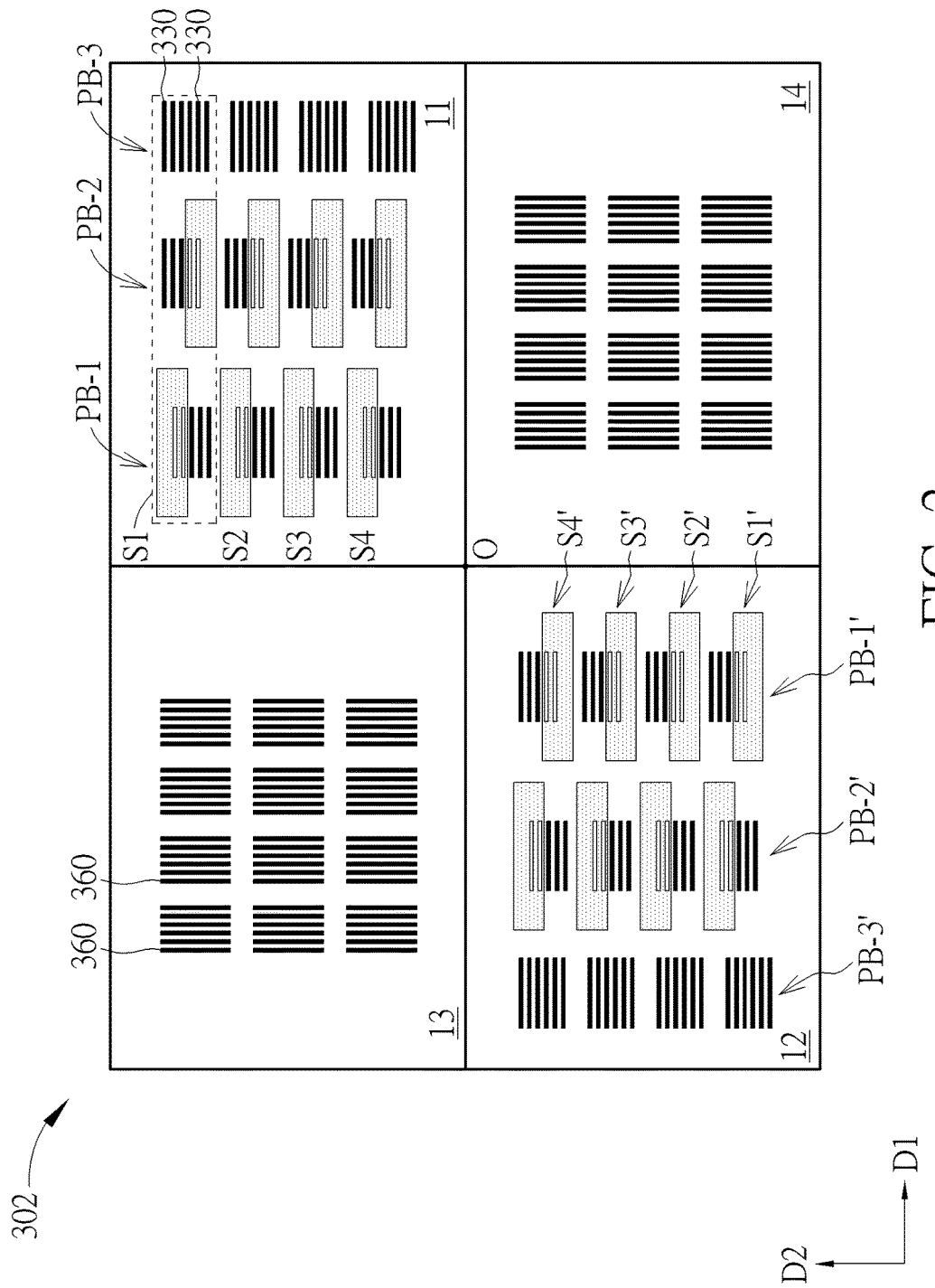
Figure 3:
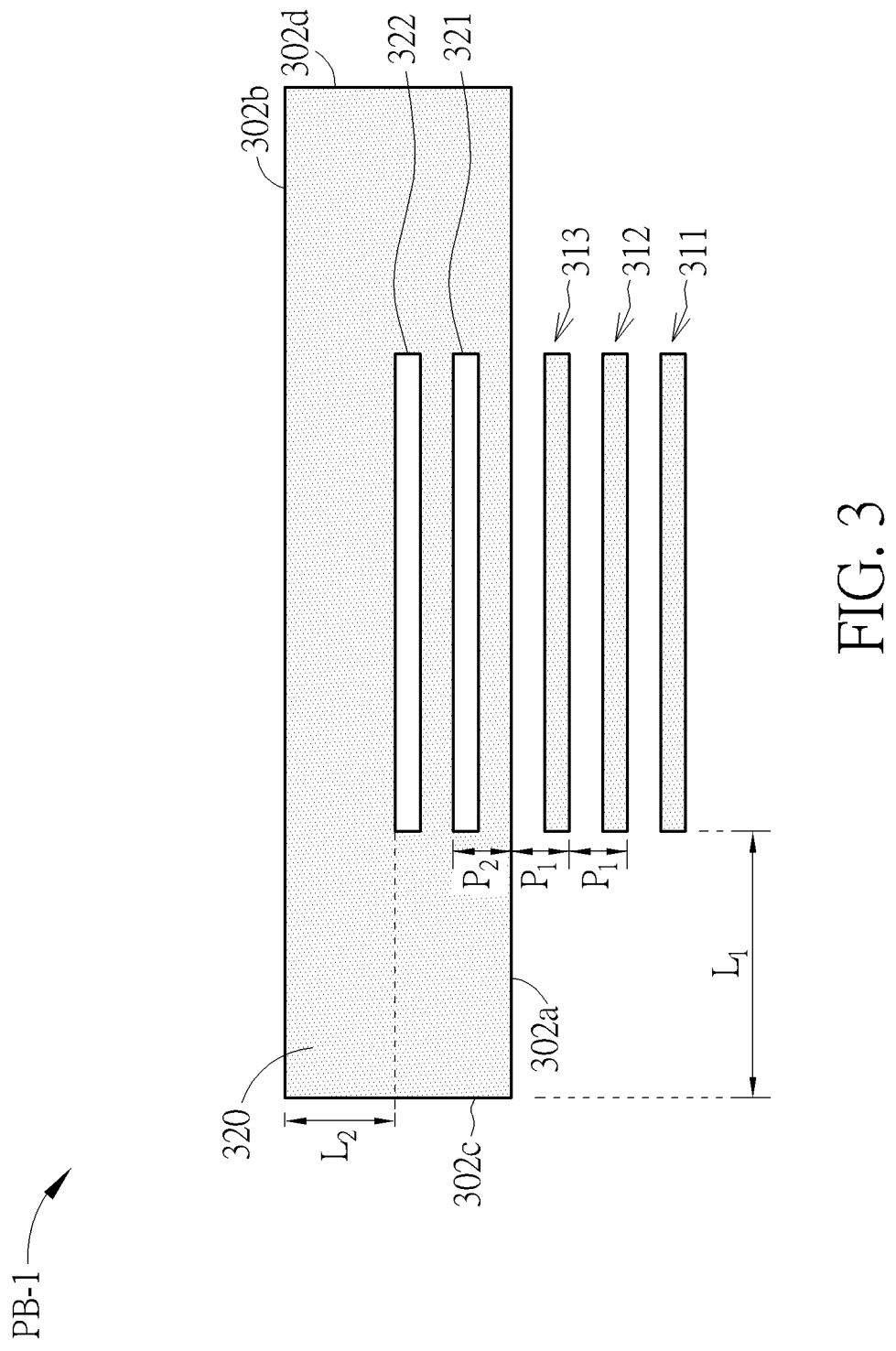

Please refer to FIG. 2 and FIG. 3, which are schematic diagrams illustrating one embodiment of a measurement mark according to the present invention. FIG. 3 is an enlarged schematic view of an inner pattern block in FIG. 2. As shown in FIG. 2, the measurement mark 302 of this embodiment includes four rectangular regions 11~14 arranged in a 2×2 array about a center O. The four rectangular regions 11~14 include a first region 11 and a second region 12 arranged diagonally, and a third region 13 and a fourth region 14 arranged diagonally. In the first region 11, there are repeatedly appearing sets of patterns aligned in the second direction D2, such as the pattern sets S1 to S4. Each pattern set includes a first inner pattern block PB-1, a first middle pattern block PB-2 and a first outer reference pattern block PB-3, which are sequentially arranged along the first direction D1.

According to an embodiment of the present invention, when the measurement mark 302 is rotated 180 degrees with respect to the center O, its corresponding position of the pattern is the same, and a rotational symmetry is presented. In the embodiment shown in FIG. 2, the four pattern sets S1~S4 in the first region 11 have the same positions as the pattern groups S1'~S4' in the second region 12 after the measurement mark 302 is rotated by 180 degrees with respect to the center O. In other words, each of the pattern sets S1'~S4' in the second region 12 has a second inner pattern block PB-1', a second middle pattern block PB-2', and a second outer reference pattern block PB-3'. The pattern sets S1~S4 in the first region 11 and the pattern sets S1'~S4' in the second region 12 are rotationally symmetrical with each other.

According to an embodiment of the present invention, as shown in FIG. 3, the first inner pattern block PB-1 includes a plurality of straight-line patterns 311~313 extending along the first direction D1, and a block pattern 320, wherein the block pattern 320 is preferably a rectangular pattern.

According to an embodiment of the present invention, the block pattern 320 has a plurality of space (or hollow gap) patterns 321~322 arranged therein. Likewise, the first middle pattern block PB-2 includes a plurality of straight-line patterns extending along the first direction D1 and a block pattern having a plurality of space patterns arranged therein. According to an embodiment of the present invention, the first inner pattern block PB-1 and the first middle pattern block PB-2 are rotationally symmetric with each other. In other words, the first inner pattern block PB-1 is the same as the first middle pattern block PB-2 after being rotated 180 degrees with respect to the center O.

According to an embodiment of the present invention, the plurality of space patterns 321~322 in the block pattern 320 are arranged parallel to each other and extend along the first direction D1. According to an embodiment of the present invention, the plurality of straight-line patterns 311~313 are arranged at a first pitch $P_1$, and the plurality of space patterns 321~322 are arranged at a second pitch $P_2$. According to an embodiment of the present invention, the first pitch $P_1$ may be equal to the second pitch $P_2$. In other embodiments, the first pitch $P_1$ may not be equal to the second pitch $P_2$. It should be noted that the number of the plurality of space patterns and the number of the plurality of straight-line patterns depicted in the figures are only illustrative.

According to the embodiment of the present invention, the block pattern 320 has a first longer side 320a and a second longer side 320b parallel to each other, wherein the first longer side 320a is located between the plurality of space patterns 321~322 and the plurality of straight-line patterns 311~313.

According to an embodiment of the present invention, the block pattern 320 has a first shorter side 320c and a second shorter side 320d parallel to each other, wherein the distance $L_1$ between the first shorter side 320c and one end of each of the straight-line patterns 311~313 in the first direction D1 is preferably greater than three times the first pitch $P_1$ ($L_1 > 3P_1$).

According to an embodiment of the present invention, the distance $L_2$ from the second longer side 320b to the space pattern 322 needs to be greater than three times the second pitch $P_2$ ($L_2 > 3P_2$). In other words, the plurality of space patterns 321~322 are closer to the first longer side 320a than to the second longer side 320b.

According to an embodiment of the present invention, the first longer side 320a and the second longer side 320b have the same length and are greater than the length of the plurality of space patterns 321~322 or the plurality of straight-line patterns 311~313. According to an embodiment of the present invention, the lengths of the plurality of space patterns 321~322 or the plurality of straight-line patterns 311~313 may be the same, but is not limited thereto.

According to an embodiment of the present invention, the first outer reference pattern block PB-3 consists of a plurality of repeated straight-line patterns 330 arranged parallel to each other at a predetermined pitch and extending along the first direction D1. According to an embodiment of the present invention, the aforesaid predetermined pitch may be the same as the second pitch $P_2$ of the plurality of space patterns 321~322, but is not limited thereto.

According to an embodiment of the present invention, the third region 13 and the fourth region 14 may include a plurality of straight line patterns 360 arranged parallel to each other at a predetermined pitch and extending along the second direction D2. According to an embodiment of the present invention, the aforesaid predetermined pitch may be the same as the second pitch $P_2$ of the plurality of space patterns 321~322, but is not limited thereto.

According to an embodiment of the present invention, the measurement mark 302 shown in FIG. 1 to FIG. 3 may be formed in a material layer of the wafer 300. For example, the material layer may include, but is not limited to, a photoresist layer, a semiconductor layer, a mandrel layer, a hard mask layer, an insulating layer, a metal layer, or a polycrystalline silicon layer. If the measurement mark 302 shown in FIG. 1 to FIG. 3 is formed in a photoresist layer, the measurement mark 302 may be a developed photoresist pattern, but is not limited thereto. According to another embodiment of the present invention, the measurement mark 302 shown in FIG. 1 to FIG. 3 may be a pattern on a photomask.

According to an embodiment of the present invention, if the measurement mark 302 shown in FIG. 1 to FIG. 3 is formed in a mandrel layer, and the self-aligned double patterning (SADP) process is implemented, then a spacer pattern will be formed along the perimeter (or sidewall) of the measurement mark 302 in the mandrel layer.

Figure 4:
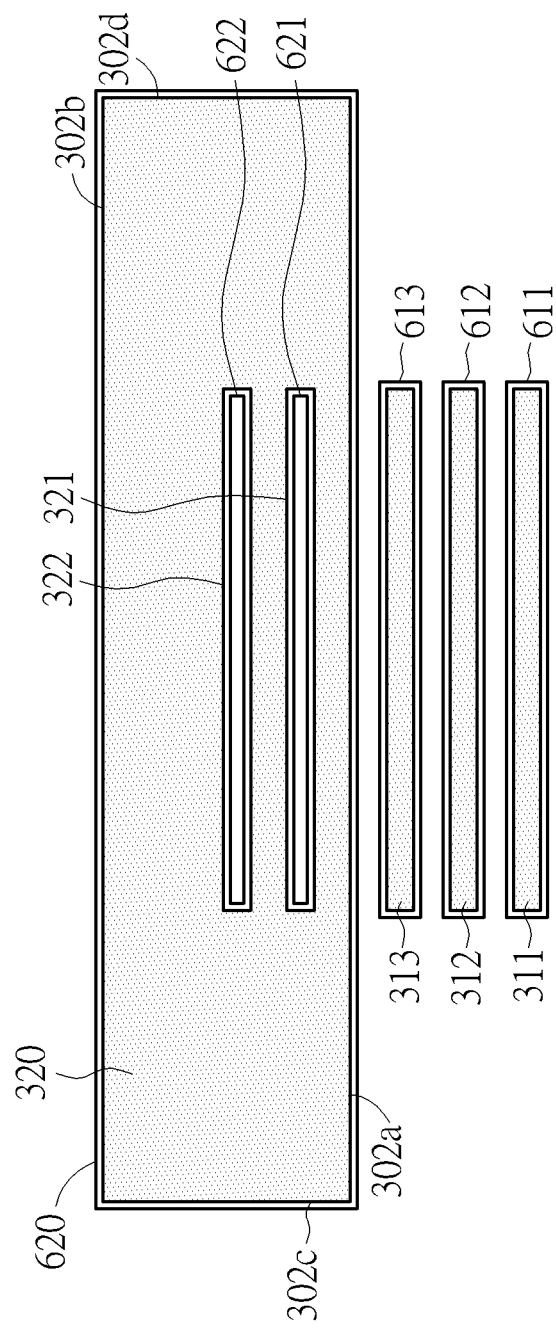
FIG. 4 is a schematic diagram showing the formation of spacer patterns after patterning of a mandrel layer in a SADP process.

Please refer to FIG. 4, which is a schematic diagram showing the formation of spacer patterns after patterning of a mandrel layer in a SADP process. The step of forming the spacer patterns may include chemical vapor deposition and etching back of a spacer material layer. As shown in FIG. 4, first spacer patterns 611~613 are respectively disposed along the periphery of each of the plurality of straight-line patterns 311~313, and second spacer patterns 621~622 are respectively disposed along the periphery of each of the plurality of space patterns 321~322. A third spacer pattern 620 is provided along the periphery of the block pattern 320. According to an embodiment of the present invention, the third spacer pattern 620 may be a closed, continuous ring pattern and surrounds the second spacer patterns 621~622. The third spacer pattern 620 is not in direct contact with the second spacer patterns 621~622.

Figure 5:
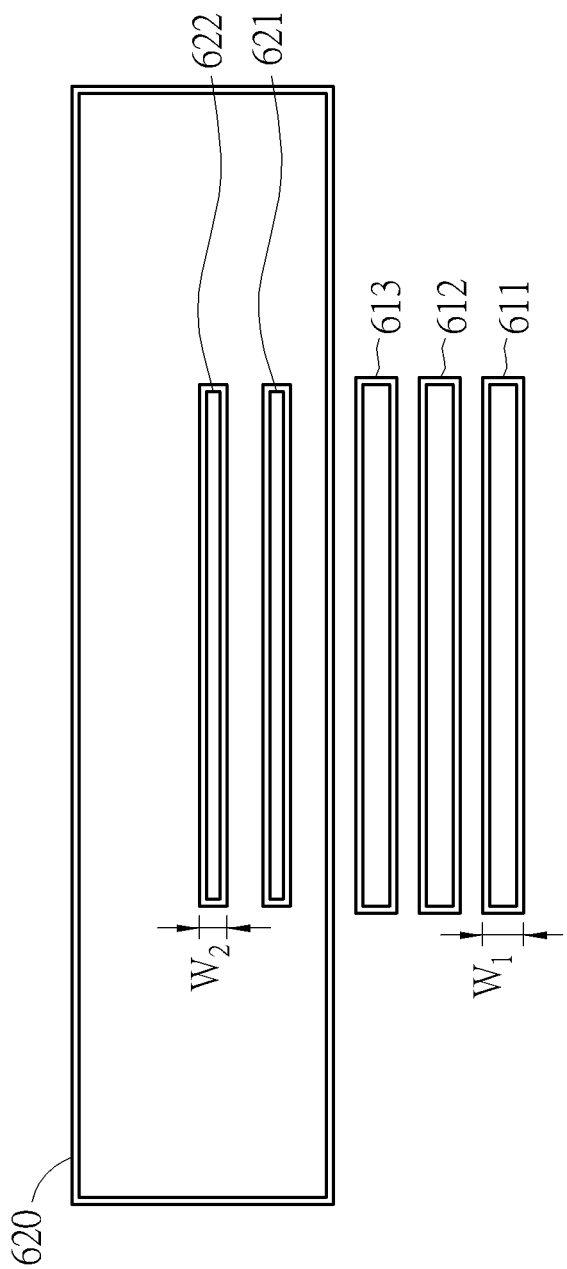
FIG. 5 is a schematic diagram showing the removal of the mandrel layer pattern after forming the spacer patterns in the SADP process.

Please refer to FIG. 5, which is a schematic diagram showing the removal of the mandrel layer pattern after forming the spacer patterns in the SADP process. As shown in FIG. 5, after forming the first spacer patterns 611~613, the second spacer patterns 621~622, and the third spacer pattern 620, the mandrel layer pattern may be removed by a selective etching process, leaving the first spacer patterns 611~613, the second spacer patterns 621~622, and the third spacer pattern 620 intact. According to the embodiment of the present invention, the width $W_1$ of each of the first spacer patterns 611~613 is greater than the width $W_2$ of each of the second spacer patterns 621~622.

Subsequently, an anisotropic dry etching process may be performed, using the first spacer patterns 611~613, the second spacer patterns 621~622, and the third spacer pattern 620 as an etch mask, to transfer the first spacer pattern 611~613, the second spacer patterns 621~622, and the third spacer pattern 620 to an underlying target material layer (not shown).

According to an embodiment of the present invention, the first inner pattern block PB-1, the first middle pattern block PB-2, and the first outer reference pattern block PB-3 in the first region 11 and the second region 12 of the measurement mark 302 shown in FIG. 1 to FIG. 3 may all be formed in the same material layer (or current layer) on the wafer 300, so that the critical dimension variation and the pitch walking phenomenon may be monitored or evaluated.

According to another embodiment of the present invention, the first inner pattern block PB-1 and the first middle pattern block PB-2 in the first region 11 and the second region 12 of the measurement mark 302 shown in FIG. 1 to FIG. 3 are formed in the same material layer (or current layer) on the wafer 300, and the first outer reference pattern block PB-3 is formed in a pre-layer or a post-layer so that the overlay accuracy of adjacent layers can be monitored and overlay error may be determined.

Another aspect of the present invention discloses a method for monitoring a semiconductor process. First, a wafer 300 is provided, which may have a material layer thereon. The material layer may include, but is not limited to, a photoresist layer, a semiconductor layer, a mandrel layer, a hard mask layer, an insulating layer, a metal layer, or a polycrystalline silicon layer.

Next, a semiconductor process is performed to form a measurement mark 302 in the material layer. The measurement mark 302 includes four rectangular regions 11-14, as shown in FIG. 1, arranged in a 2×2 array with respect to a center. The four rectangular regions 11~14 include the first region 11 and the second region 12 arranged diagonally, and the third region 13 and the fourth region 14 arranged diagonally. A plurality sets of first inner pattern block PB-1, first middle pattern block PB-2, and first outer reference pattern block PB-3 is provided in the first region 11. The semiconductor process may be a self-aligned double patterning (SADP) process.

The first inner pattern block PB-1 includes a plurality of straight-line patterns 311~313 extending along the first direction D1, and a block pattern 320. The block pattern 320 has a plurality of space patterns 321~322 therein. The first middle pattern block PB-2 also includes a plurality of straight-line patterns extending along the first direction D1 and a block pattern. The block pattern has a plurality of space patterns. The first inner pattern block PB-1 and the first middle pattern block PB-2 are rotationally symmetric with each other.

Then, a first offset (or shift amount) between the first inner pattern block PB-1 and the first outer reference pattern block PB-3, and a second offset between the first middle pattern block PB-2 and the first outer reference pattern blocks PB-3 are measured. The above measurement methods may use methods including, but not limited to, a critical-dimension scanning electron microscope (CD-SEM) or optical measurement means.

The measurement mark 302 further includes a plurality sets of second inner pattern block PB-1', second middle pattern block PB-2', and second outer reference pattern block PB-3' in the second region 12. The plural sets of the first inner pattern block PB-1, the first middle pattern block PB-2 and the first outer reference pattern block PB-3 in the first region 11 are rotationally symmetrical to the plural sets of the second inner pattern block PB-1', the second middle pattern block PB-2', and the second outer reference pattern block PB-3' in the second region 12.

The method for monitoring a semiconductor process further includes measuring a third offset between the second inner pattern block PB-2' and the second outer reference pattern block PB-3', and measuring a fourth offset between the second middle pattern the block PB-2' and the second outer reference pattern block PB-3'.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A measurement mark, comprising:
a plurality sets of first inner pattern blocks, first middle pattern blocks, and first outer reference pattern blocks, wherein each of the first inner pattern blocks comprises a plurality of line patterns extending along a first direction and a block pattern having a plurality of space patterns arranged therein, wherein each of the first middle pattern blocks comprises a plurality of line patterns extending along the first direction and a block pattern having a plurality of space patterns arranged therein;

a first spacer pattern disposed along a periphery of each of the line patterns; and a second spacer pattern disposed along a periphery of each of the space patterns.

2. The measurement mark according to claim 1 further comprising four rectangular regions arranged in a 2×2 array about a center, wherein the four rectangular regions comprise a first region and a second region arranged diagonally, and a third region and a fourth region arranged diagonally, wherein the plurality sets of first inner pattern blocks, first middle pattern blocks, and first outer reference pattern blocks are disposed within the first region.

3. The measurement mark according to claim 2 further comprising a plurality sets of second inner pattern blocks, second middle pattern blocks, and second outer reference pattern blocks disposed within the second region, wherein the plurality sets of first inner pattern blocks, first middle pattern blocks, and first outer reference pattern blocks within the first region are rotationally symmetrical to the plurality sets of second inner pattern blocks, second middle pattern blocks, and second outer reference pattern blocks within the second region.

4. The measurement mark according to claim 1, wherein the plurality of line patterns is arranged at a first pitch and the plurality of space patterns is arranged at a second pitch.

5. The measurement mark according to claim 4, wherein the first pitch is equal to the second pitch.

6. The measurement mark according to claim 4, wherein the block pattern has a first longer side and a second longer side parallel to each other, wherein the first longer side is located between the plurality of space patterns and the plurality of line patterns.

7. The measurement mark according to claim 6, wherein a distance from the second longer side to the plurality of space patterns is greater than three times the second pitch.

8. The measurement mark according to claim 1 further comprising a third spacer pattern disposed along the periphery of each of the block patterns and surrounding the second spacer patterns.

9. The measurement mark according to claim 1, wherein a width of the first spacer pattern is greater than that of the second spacer pattern.

10. The measurement mark according to claim 3, wherein the third region and the fourth region comprise a plurality of line patterns extending along a second direction.

11. The measurement mark according to claim 1, wherein the first inner pattern blocks are rotationally symmetrical to the first middle pattern block.

12. The measurement mark according to claim 1, wherein the first inner pattern blocks, the first middle pattern blocks, and the first outer reference pattern blocks are disposed in a current layer on a wafer.

13. The measurement mark according to claim 1, wherein the first inner pattern blocks and the first middle pattern blocks are disposed in a current layer on a wafer, and the first outer reference pattern blocks are disposed in a pre-layer or a post-layer.

* * * * *